United States Patent
Kim et al.

(10) Patent No.: US 8,081,517 B2
(45) Date of Patent: Dec. 20, 2011

(54) SOLID STATE STORAGE SYSTEM FOR UNIFORMLY USING MEMORY AREA AND METHOD CONTROLLING THE SAME

(75) Inventors: Jin Chul Kim, Ichon-si (KR); Young Kyun Shin, Ichon-si (KR)

(73) Assignee: Hynix Semiconductor Inc., Gyeonggi-do (KR)

(*) Notice: Subject to any disclaimer, the term of this patent is extended or adjusted under 35 U.S.C. 154(b) by 229 days.

(21) Appl. No.: 12/493,861

(22) Filed: Jun. 29, 2009

(65) Prior Publication Data
US 2010/0232226 A1  Sep. 16, 2010

(30) Foreign Application Priority Data
Mar. 10, 2009 (KR) .......... 10-2009-0020225

(51) Int. Cl.
*G11C 16/04* (2006.01)
(52) U.S. Cl. .......... 365/185.19; 365/185.11; 365/185.29
(58) Field of Classification Search .......... 365/185.04, 365/185.09, 185.17, 185.18, 185.19, 11, 365/29; 711/103, 156
See application file for complete search history.

(56) References Cited

U.S. PATENT DOCUMENTS

| | | | |
|---|---|---|---|
| 6,985,992 B1 | 1/2006 | Chang | |
| 7,120,729 B2 | 10/2006 | Gonzalez et al. | |
| 7,441,067 B2 | 10/2008 | Gorobets et al. | |
| 2005/0047207 A1 | 3/2005 | Sugiura et al. | |
| 2007/0276987 A1* | 11/2007 | Luo et al. | 711/103 |
| 2008/0205137 A1* | 8/2008 | Yanagidaira et al. | 365/185.03 |
| 2008/0313505 A1 | 12/2008 | Lee et al. | |
| 2009/0077429 A1 | 3/2009 | Yim et al. | |
| 2009/0094409 A1 | 4/2009 | Yeh et al. | |
| 2009/0157952 A1 | 6/2009 | Kim et al. | |
| 2010/0246265 A1* | 9/2010 | Moschiano et al. | 365/185.11 |

FOREIGN PATENT DOCUMENTS

| | | |
|---|---|---|
| JP | 2003-256289 A | 9/2003 |
| WO | 2008/029457 A1 | 3/2008 |

OTHER PUBLICATIONS

Kang-Deog Suh, et al; "A 3.3 V 32 Mb NAND Flash Memory with Incremental Step Pulse Programming Scheme", IEEE Journal of Solid-State Circuits, vol. 30, No. 11, Nov. 1995, pp. 1149-1156.

* cited by examiner

*Primary Examiner* — Anh Phung
*Assistant Examiner* — Hai Pham
(74) *Attorney, Agent, or Firm* — Ladas & Parry LLP

(57) ABSTRACT

A solid state storage system includes a memory area having a plurality of pages and is capable of storing program information about each page. The memory area stores the number of pulse counts applied to each page. A main memory controller receives the program information from the memory area and determines whether to program pages according to the program information. The main memory controller determines whether the program information for a page is at a predetermined amount and if the corresponding page should be programmed again or not.

13 Claims, 4 Drawing Sheets

SOLID STATE STORAGE SYSTEM FOR UNIFORMLY USING MEMORY AREA AND METHOD CONTROLLING THE SAME

CROSS-REFERENCES TO RELATED PATENT APPLICATION

The present application claims priority under 35 U.S.C 119(a) to Korean Application No. 10-2009-0020225, filed on Mar. 10, 2009, in the Korean Intellectual Property Office, which is incorporated herein by reference in its entirety as set forth in full.

BACKGROUND

1. Technical Field

The present invention relates generally to a solid state storage system, and more specifically, to a solid state storage system for using a memory area uniformly and a method of controlling the same.

2. Related Art

Generally, non-volatile memory is used as storage memory for most portable information devices. Recently, SSDs (Solid State Drive) using a NAND flash memory have come into the market. The SSDs are being used as substitutes for HDDs (Hard Disk Drive) in PCs (Personal Computer). Due to this shift in the market, SSDs are expected to rapidly erode the market share of HDDs.

A solid state storage system using the NAND flash memory includes a memory area composed of a plurality of blocks that include a plurality of pages. Due to the characteristics of the NAND flash memory, data programming is performed according to a page-unit, while updating or erasing of the data is performed according to a block-unit. That is, to update the contents in a page that is storing predetermined data, the entire block including the corresponding page must be erased first and then subsequently perform the programming for the pages. Therefore, it is known that the lifetime (for wearing limit) for a flash memory unit is generally limited by the frequency of use of the block, for example, the erase cycle or the erase count.

FIGS. 1A and 1B are graphs showing examples of when a specific block or a specific memory area is excessively used in a solid state storage system in the conventional art. The X-axis represents a memory address and the Y-axis represents an erase count in the graphs.

Referring to the graph of FIG. 1A, shown is an example of when the memory area between the 1500 address and the 2000 address is excessively used as compared to the other memory areas. Referring to the graph of FIG. 1B, shown is when the memory areas of specific addresses (for convenience, a$^{th}$ address and b$^{th}$ address are illustrated as examples) are excessively used, despite the fact that the areas of other addresses still maintain a fresh memory state. Due to the excessive use, an error is generated in the solid state storage system at the indicated memory areas.

As described, it is known that depending on the types of cells included in the flash memories, the lifetime of the cells is reached after a certain number of operations. For Example, when an SLC (Single Level Cell) is erased about 100,000 times and an MLC (Multi Level Cell) is erased about 5000 to 10,000 times, the lifetime of the cells may be exceeded. Therefore, it is important to maintain the flash memory such that all memory areas are uniformly used in order to effectively use SSDs for commercial purposes.

To address these issues, the main controller of a solid state storage system performs wear-leveling for blocks so that the use frequency of all blocks of the memory areas is maintained appropriately and the memory areas are used uniformly; however, such operations increase the load of the main controller and may contribute to performance deterioration of the entire solid state storage system.

SUMMARY

A solid state storage system capable of controlling a memory area to be used uniformly is described herein.

A method of controlling a solid state storage system capable of controlling a memory area to be used uniformly is described herein.

According to one embodiment of the present invention, a solid state storage system includes: a memory area that includes a plurality of pages and stores information on a program about each page; and a main memory controller that determines whether to program the pages according to the information on the program.

According to another embodiment of the present invention, a solid state storage system includes: a memory area that includes a plurality of chips each of which includes a plurality of pages, and a life span management unit that stores the program frequency of the pages; and a main memory controller that receives the program frequency of the corresponding page from the memory area and determines whether to program the corresponding page.

According to still another embodiment of the present invention, a method of controlling a solid state storage system includes: increasing a program pulse as much as a predetermined level of voltage and applying the program pulse to a corresponding page of a memory area, in response to an external program command; storing the count of the program pulse when the program is finished in the memory area; and determining whether to program the corresponding page, by using the program pulse count stored in the memory area, by a main memory controller.

These and other features, aspects, and embodiments are described below in the period "Detailed Description."

BRIEF DESCRIPTION OF THE DRAWINGS

Features, aspects, and embodiments are described in conjunction with the attached drawings, in which.

DETAILED DESCRIPTION

A solid state storage system according to an embodiment of the present invention can uniformly use memory areas of the solid state storage system while reducing a load of the main memory controller. Further, it is also possible to improve the overall speed and performance of the solid state storage system since the work load to be performed by the main memory controller is reduced.

A semiconductor integrated circuit according to an embodiment of the present invention is described hereafter in detail with reference to the accompanying drawings.

Figure 1A:
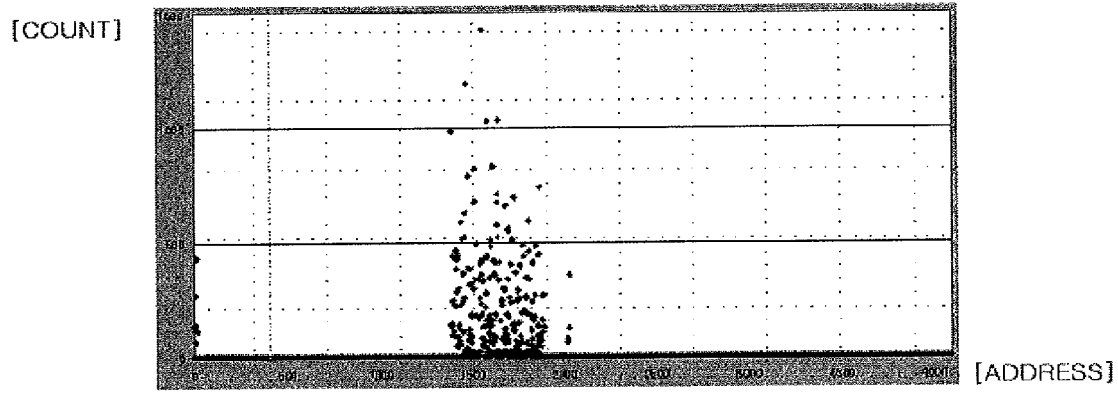
FIGS. 1A and 1B are graphs showing examples of non-uniform memory areas in the conventional art.
Figure 1B:
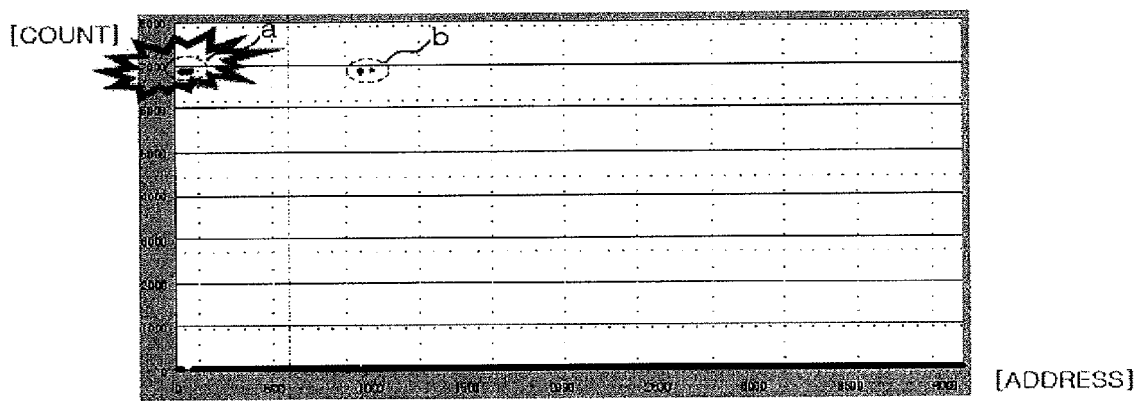
Figure 2:
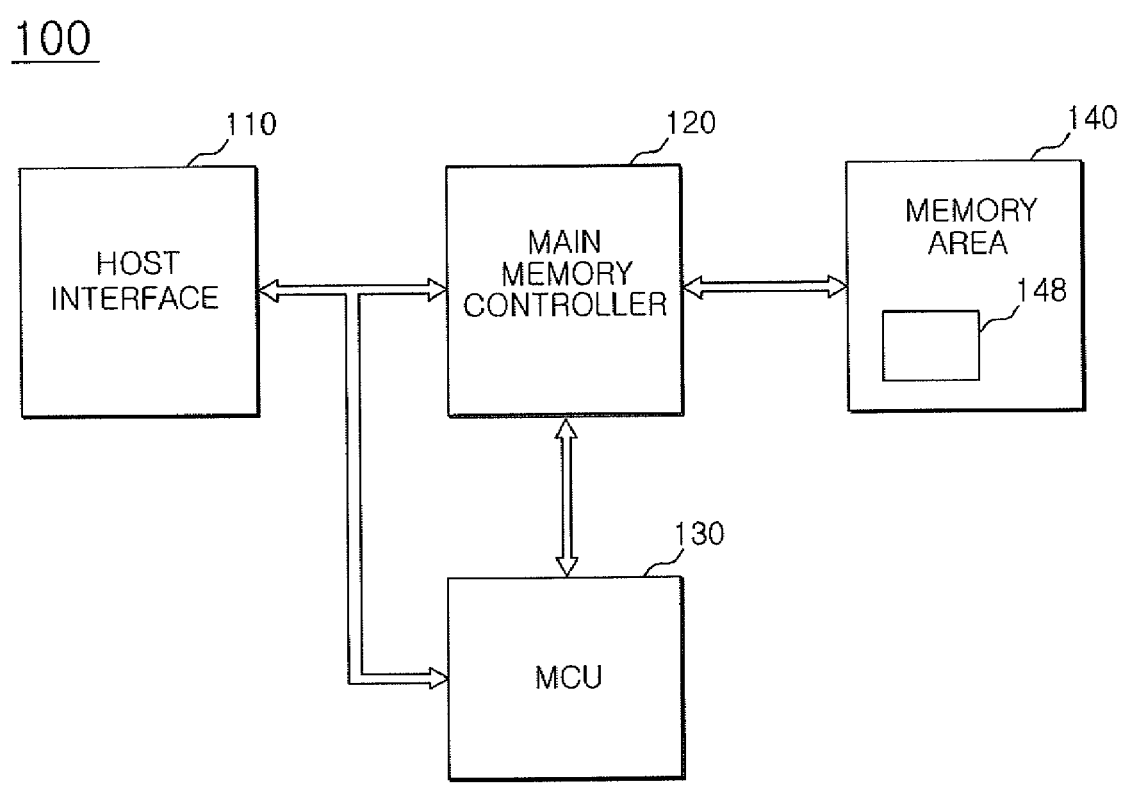
FIG. 2 is a block diagram showing a solid state storage system according to an embodiment of the present invention.

FIG. 2 is a block diagram of a solid state storage system according to an embodiment of the present invention.

Referring to FIG. 2, the solid state storage system includes a host interface 110, a main memory controller 120, an MCU (Micro Control Unit), and a memory area 140.

The host interface 110 is connected to the main memory controller 120 and transmits/receives a control command, address signals, and data signals between an external host (not shown) and the main memory controller 120. The interface type between the host interface 110 and the external host (not shown) may be any one of a serial ATA (Serial Advanced Technology Attachment; SATA) type, a parallel ATA (Parallel Advanced Technology Attachment; PATA) type, an SCSI type, an Express Card type, and a PCI-Express type, and is not limited thereto.

The main memory controller 120 selects a predetermined NAND flash memory element (not shown) from a plurality of NAND flash memory elements of a memory area 140 and provides a programming, erasing, and reading command. According to an embodiment of the present invention, the main memory controller 120 can control the memory area 140 so that it is used uniformly by using information on the program pulse count from the memory area 140, which is described below in further detail.

The MCU 130 transmits/receives a control command, address signals, and data signals, etc. to/from the main memory controller 120, and stores a portion of the information. A buffer, such as SRAM (Static Random Access Memory), may be provided in the MCU 130.

The memory area 140 includes a plurality of NAND flash elements (not shown) and a lifetime management unit 148. The memory area 140 is controlled by the main memory controller 120 to perform operations including the programming, erasing, and reading of data, using the plurality of NAND flash elements. Further, the memory area 140 according to an embodiment of the present invention can store the program pulse counts of the NAND flash elements (not shown) since the memory area 140 includes the life span management unit 148.

In more detail, the lifetime management unit 148 makes it possible to indirectly check the use frequency of the NAND flash elements in the memory area 140 by storing the program pulse count that is used when programming data. That is, the memory area 140 provides the program pulse count to the main memory controller 120. The main memory controller 120 can then determine whether the program pulse count is a critical value and control a program to be executed on a page other than the page corresponding to a critical value.

As described above, according to an embodiment of the present invention, the memory area 140 stores the program pulse count representing the use frequency of the page in the NAND flash element such that the memory controller 120 can use this information to uniformly use the memory area 140. In the conventional art, not only does it take a lot of time for the main memory controller 120 to perform wear-leveling directly to the memory area 140, but the main memory controller 120 has difficulty in executing other processes while performing the wear-leveling. However, according to an embodiment of the present invention, it is possible to achieve uniform use of the memory area 140 while at the same time reducing the load given to the main memory controller 120 when performing the wear-leveling.

This operation is described in detail with reference to the following drawings.

Figure 3:
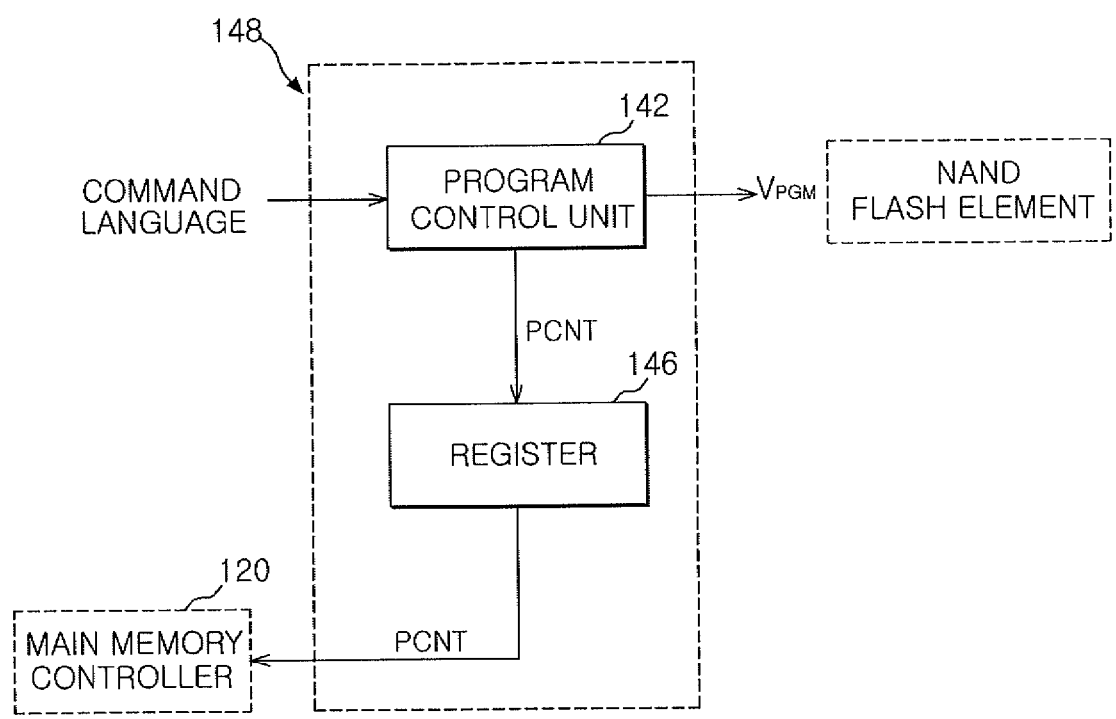
FIG. 3 is a conceptual block diagram showing a lifetime management unit according to the embodiment shown in FIG. 2.

FIG. 3 is a conceptual block diagram of the lifetime management unit 148.

The lifetime management unit 148 includes a program control unit 142 and a register 146.

The program control unit 142 provides a program pulse '$V_{PGM}$' at a predetermined voltage to the corresponding page of the NAND flash element (indicated by a dotted line) in response to an external command language. As is well known to those have skill in the conventional art, the programming of a NAND flash element is executed according to page-unit. When a high voltage, e.g., a voltage of 18 to 20V, is applied to the word line of the corresponding page, the electric charges are stored in a floating gate due to the F-N tunneling effect.

A method using ISPP (Incremental Step Pulse Programming) is exemplified as the method for applying a program voltage and the method is not limited thereto. The method first applies the program pulse '$V_{PGM}$' at a predetermined voltage in response to a program command and gradually increases the voltage of the program pulse '$V_{PGM}$' to a predetermined voltage while verifying whether the program is successful every time a pulse is applied.

Therefore, the program control unit 142 has to apply the program pulse '$V_{PGM}$' more than a predetermined number of times until the program is completed. The program control unit 142 continuously counts the program pulse count 'PCNT' until the program is completed successfully. The program control unit 142 exemplified herein, though not shown, is a common ISPP type program control unit including a counter.

The register 146 stores the counted program pulse count 'PCNT' when the program is successful.

That is, the register 146 according to an embodiment of the present invention stores a program pulse count 'PCNT' for every page and provides the program pulse counts to the main memory controller 120. The program pulse counts 'PCNT' for each page are accumulated by repeating the above process. Therefore, the main memory controller 120 determines whether the stored program pulse count of the corresponding page is at a predetermined critical value and detects the lifetime limit of the corresponding page when the program pulse count is at the critical value. Accordingly, the main memory controller 120 prevents a program from being executed again in the corresponding page having a program pulse count at the critical value and allows the program to be executed in another page in response to a subsequent program command.

Therefore, according to an embodiment of the present invention, it is easier to manage the lifetime of the memory area 140 using the information provided from the lifetime management unit 148 since the lifetime management unit 148 counts the program pulses for each page. Meanwhile, for the convenience of description, it is exemplified herein that the NAND flash element includes 128 pages per block.

In other words, if a specific page is frequently programmed, the accumulated program pulse count 'PCNT' would be considerably large and the specific page would be substantially worn out. In this case, it is necessary to prevent an additional program command from being executed in the specific page. In an embodiment of the present invention, the main memory controller 120 receives the program pulse count 'PCNT' that is stored in the register 146 and only controls whether the corresponding pages should be programmed. As a result, the load required of the main memory controller 120 when performing the operation can be reduced.

Figure 4:
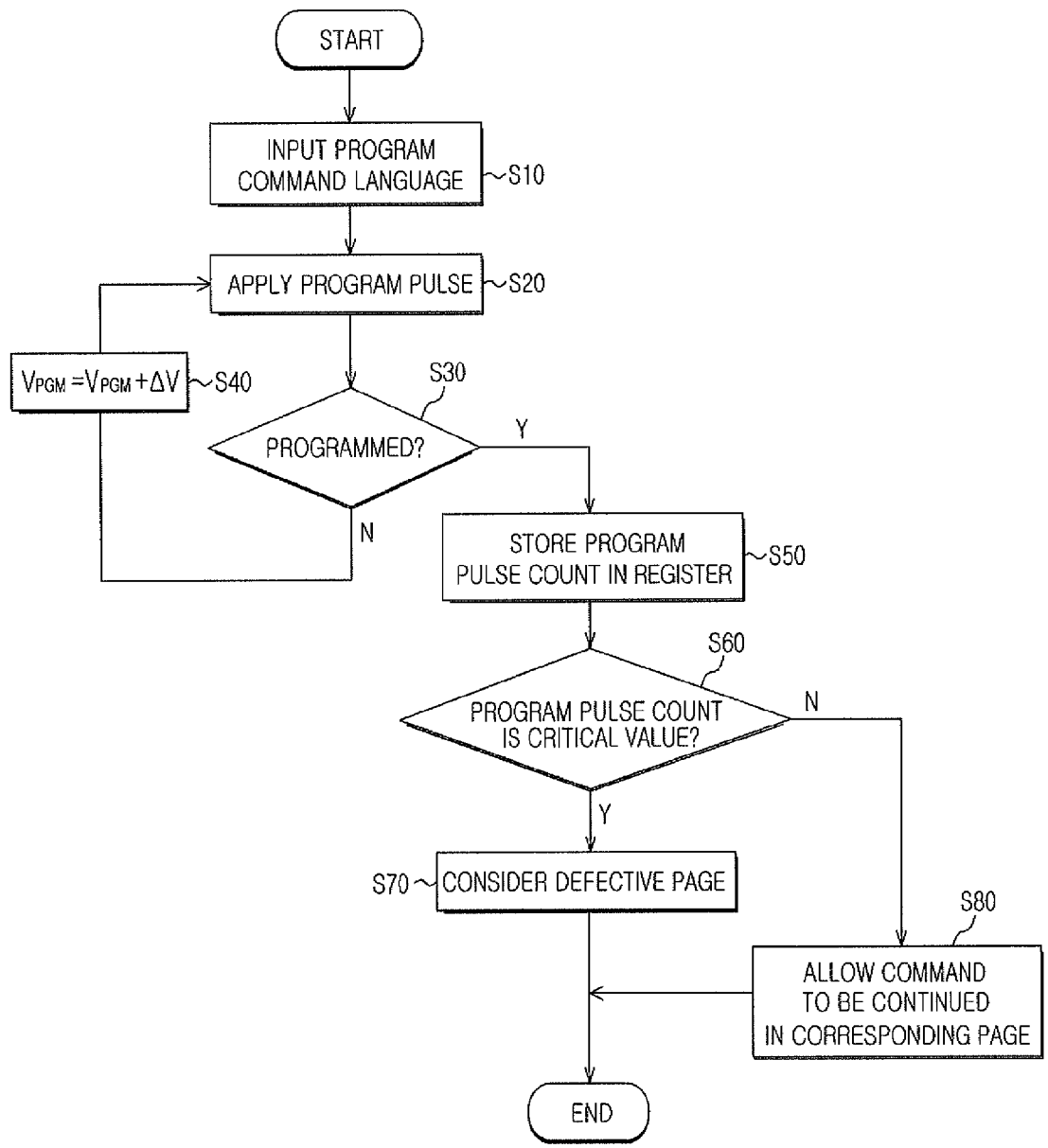
FIG. 4 is a flowchart showing a method of controlling the solid state storage system shown in FIG. 2.

FIG. 4 is a flowchart showing a method of controlling the solid state storage system shown in FIG. 2.

Referring to FIGS. 2 to 4, a program command language is externally inputted (S10).

The program control unit 142 applies a first program pulse having a predetermined voltage (S20).

After the first program pulse '$V_{PGM}$' is applied, it is verified whether the program is successful (S30).

If the programming is not successful, a second program pulse having a higher voltage than the first program pulse provided in the previous step is applied again (S20) by increasing the voltage level of the first program pulse '$V_{PGM}$' by as much as a predetermined voltage step '$\Delta V$' (S40). Steps S20 through S40 are repeated until the programming is successful.

When the program is successful, the counted number of program pulses applied to the corresponding page is stored in the register 146 by counting the number of program pulse steps (S50). The program pulse count is then provided to the main memory controller 120 (S50).

The main memory controller 120 then determines whether the program pulse count is at a critical value (S60).

When the program pulse count of the corresponding page is at the critical value, the main memory controller considers the page to be a defective page and controls the corresponding page so that it is not accessed (S70).

However, when the program pulse count of the corresponding page is not at the critical value, the main memory controller allows a program to be continuously executed in the corresponding page (S80).

As described above, the solid state storage system according to an embodiment of the present invention can count the program pulses for pages and utilize this information to uniformly use the entire memory area 140 according to the program pulse count. Further, it is possible to reduce the load required of the main memory controller 120 when performing the operation by storing the program pulse count in a register in the memory area 140. It is also possible to more efficiently manage the memory area 140 using the program pulse count 'PCNT' as a reference for wear-leveling and for controlling of smaller pages. According to the present invention, the memory area 140 is more efficiently managed than the methods of the conventional art in which blocks are controlled to maintain the lifetime of the pages. In addition, the present invention can be freely applied to various control units or controllers that control the memory area 140 because the counting and storing of the program pulse counts used for the wear-leveling can be implemented in the memory area 140 independent of the control unit or controller.

It will be apparent to those skilled in the art that various modifications and changes may be made without departing from the scope and spirit of the invention. Therefore, it should be understood that the above embodiment is not limitative, but illustrative in all aspects. The scope of the invention is defined by the appended claims rather than by the description preceding them, and therefore all changes and modifications that fall within metes and bounds of the claims, or equivalents of such metes and bounds are therefore intended to be embraced by the claims.

What is claimed is:

1. A solid state storage system, comprising:
   a memory area including a plurality of pages and storing program information for each of the plurality of pages; and
   a memory controller determining whether to program the plurality of pages according to the stored program information corresponding to each page,
   wherein the memory area counts a number of program pulses when the program operation of a corresponding page is finished and stores the number as the program information for the corresponding page.

2. The solid state storage system according to claim 1, wherein program pulses are applied to the memory area while programming one of the plurality of pages and the program pulses being increased to a predetermined level of voltage until programming of a corresponding page is finished.

3. The solid state storage system according to claim 1, wherein the memory controller determines whether to program a corresponding page by receiving the program information from the memory area and determines whether the number of program pulse of the corresponding page exceeds a predetermined critical value.

4. The solid state storage system according to claim 1, wherein the memory area includes a plurality of NAND flash elements.

5. A solid stage storage system, comprising:
   a memory area including a plurality of chips, each chip including a plurality of pages, and a lifetime management unit storing program frequency information for each of the plurality of pages; and
   a memory controller that receives the program frequency information of a corresponding page from the memory area and determines whether to program the corresponding page according to the received program frequency information,
   wherein the lifetime management unit includes:
      a program control unit providing a program pulse at a predetermined voltage according to ISPP (Incremental Step Pulse Programming) to a corresponding page in response to a program command and counting the program pulses provided; and
      a register storing the count result when a programming of the corresponding page is finished as the program frequency information.

6. The solid state storage system according to claim 5, wherein the program control unit increases the predetermined voltage of the program pulse up to a predetermined voltage level, applies it to the corresponding page, and verifies whether the programming of the corresponding page is successful every time the program pulse is applied.

7. The solid state storage system according to claim 5, wherein the register provides the count result as the program frequency information to the main memory controller.

8. The solid state storage system according to claim 7, wherein the memory controller receives the count result as the program frequency information, and when the count result for a corresponding page exceeds a predetermined critical value, executes a program command in a page other than the corresponding page having the count result exceeding the predetermined critical value in a next program command.

9. The solid state storage system according to claim 5, wherein the chip in the memory area is a NAND flash element.

10. A method of controlling a solid state storage system, comprising:
    increasing a program pulse up to a predetermined level of voltage and applying the program pulse to a corresponding page of a memory area in response to an external program command;
    storing a number of increases of the program pulse as a program pulse count when the programming of the corresponding page is finished in the memory area; and
    determining by a main memory controller, whether to program the corresponding page according to the program pulse count stored in the memory area.

11. The method of controlling a solid state storage system according to claim 10, wherein the applying of the program pulse further includes verifying whether the programming of the corresponding page is successful every time a pulse is applied when increasing the voltage of the program pulse.

12. The method of controlling a solid state storage system according to claim 10, wherein the determining of whether to program the corresponding page prevents a program from being executed in the corresponding page in a next program command by considering the corresponding page to be a defective page when the program pulse count of the corresponding page exceeds a critical value.

13. The method of controlling a solid state storage system according to claim 12, wherein a program command is executed in a page other than the corresponding page in the next program command when the corresponding page is considered to be the defective page.

* * * * *